United States Patent
McIntyre et al.

(10) Patent No.: US 8,169,277 B2
(45) Date of Patent: May 1, 2012

(54) RADIO FREQUENCY DIRECTIONAL COUPLER DEVICE AND RELATED METHODS

(75) Inventors: John Robert McIntyre, Rochester, NY (US); Anthony Clement Manicone, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 287 days.

(21) Appl. No.: 12/709,038

(22) Filed: Feb. 19, 2010

(65) Prior Publication Data

US 2011/0204992 A1     Aug. 25, 2011

(51) Int. Cl.
*H01P 5/12*     (2006.01)
*H01P 1/22*     (2006.01)

(52) U.S. Cl. ......................................... 333/109; 333/116

(58) Field of Classification Search ................ 333/109, 333/110, 111, 112, 115, 116, 238
See application file for complete search history.

(56) References Cited

U.S. PATENT DOCUMENTS

| | | | |
|---|---|---|---|
| 4,622,527 A | 11/1986 | Carlson | 333/182 |
| 5,347,244 A | 9/1994 | Monti | 333/115 |
| 5,570,069 A | 10/1996 | Franke | 333/115 |
| 6,791,274 B1 | 9/2004 | Hauer et al. | 315/111.21 |
| 7,821,352 B1* | 10/2010 | Sanvoravong et al. | 333/116 |
| 7,961,064 B2* | 6/2011 | Kearns et al. | 333/109 |
| 2007/0018752 A1 | 1/2007 | Miller | 333/33 |
| 2007/0279147 A1 | 12/2007 | Dupont et al. | 333/109 |
| 2011/0148544 A1* | 6/2011 | Hirai et al. | 333/116 |
| 2011/0169590 A1* | 7/2011 | Namerikawa et al. | 333/136 |

FOREIGN PATENT DOCUMENTS

| | | |
|---|---|---|
| EP | 1863116 | 5/2007 |
| WO | 98/05120 | 2/1998 |
| WO | 02/054092 | 7/2002 |

OTHER PUBLICATIONS

Anaren, Zinger II, 20dD Directional Coupler, XC1500A-20S, Product Information, 2010, http://www.anaren.com/products.
Maloratsky, Couplers Shrink HF/VHF/UHF Designs, A Novel Approach to Designing Directional Couplers Delivers Highly Integrated Solutions with Excellent Broadband Coupling Flatness, Microwaves & RF, Jun. 2000.
Torsiello et al., A Practical Approach to a Compact, Wide-Band SMT Directional Coupler, Feb. 2008, High Frequency Electronics.

* cited by examiner

*Primary Examiner* — Dean O Takaoka
(74) *Attorney, Agent, or Firm* — Allen, Dyer, Doppelt, Milbrath & Gilchrist, P.A.

(57) ABSTRACT

An electronic device may include a printed circuit board (PCB) including a ground plane and having first and second opposing surfaces. The electronic device may also include a radio frequency (RF) directional coupler carried by the first surface of the PCB and including a housing and circuitry therein defining an input port, an output port, and first and second monitoring ports. A first monitoring circuit may be carried by the first surface of the PCB and connected to the first monitoring port. The electronic device may also include a via conductor connected to the second monitoring port and extending through the PCB to the second surface thereof. A second monitoring circuit may also be carried by the second surface of the PCB and connected to the via conductor.

20 Claims, 9 Drawing Sheets

RADIO FREQUENCY DIRECTIONAL COUPLER DEVICE AND RELATED METHODS

FIELD OF THE INVENTION

The present invention relates to the field of communications and, more particularly, to radio frequency couplers and related methods.

BACKGROUND OF THE INVENTION

A typical broadband power amplifier may include a radio frequency (RF) directional coupler. For example, a typical broadband power amplifier may be a multi-octave power amplifier that generally needs a broadband, multi-octave RF directional coupler for transmitter gain control (TGC). The broadband, multi-octave RF directional coupler may also be needed for voltage standing wave ratio (VSWR) detection, and receive (RX) protect detection. For example, a power amplifier covering a frequency range of about 225-2000 MHz covers operating bands where both very high frequency (VHF) and microwave design techniques may be used. However, neither a VHF nor a microwave approach may be sufficient for the overall desired operating band.

For example, a prior art system, as illustrated in FIG. 1, includes a toroidal directional coupler including two coupled toroidal transformers 13a, 13b. The toroidal directional coupler includes an input port 16a, and an output port 16b. The toroidal directional coupler also includes a forward coupled power port 17a, and a reflected coupled power port 17b. A power amplifier 11 is coupled to the toroidal directional coupler input port 16a, and an antenna 14 is coupled to the toroidal directional coupler output port 16b. Respective attenuators 15a, 15b are coupled to the forward and reflected coupled ports 17a, 17b. Respective detectors 12a, 12b are coupled to the attenuators 15a, 15b.

The prior art system 10 generally requires, for a particular application, about a −35 dB coupling, and a flat response across the frequency range of 225-2000 MHz. The coupling is determined by the maximum output power of the power amplifier 11, a response of the detectors 12a, 12b, and the dynamic range of the system 10. However, the toroidal directional couplers 13a, 13b may perform poorly above 1.5 GHz, but provide improved bandwidth at lower frequencies. While toroidal couplers are typically used to achieve a bandwidth greater than one octave, using a toroidal coupler may cause problems above 1.5 GHz, as the loss is relatively high and directivity is relatively low.

In contrast, transmission line (stripline, microstrip, suspended stripline, etc.) couplers may have improved operation in the GHz frequencies, but may become too large in size to use near lower frequencies, for example, 225 MHz. However, unlike a toroidal coupler, a transmission line coupler is also typically limited to bandwidths of about one octave.

A transmission line coupler, for example, a stripline coupler, would be commonly used for applications above 800 MHz covering relatively narrow bands. However, a stripline coupler that spans 225-2000 MHz would have an increased overall size, which may make it increasingly difficult for a reduced size application, for example, in portable applications.

A combination of a transmission line and a toroidal directional coupler could be used to cover this band, but using both a transmission line and a toroidal directional coupler would require twice the board space, twice the detectors, twice the peripheral circuitry, and incur more insertion loss. Additional switches and logic would also be required.

SUMMARY OF THE INVENTION

In view of the foregoing background, it is therefore an object of the present invention to provide an improved bandwidth and directivity RF directional coupler with a reduced number of components.

This and other objects, features, and advantages in accordance with the present invention are provided by an electronic device, which includes a printed circuit board (PCB) including a ground plane and having first and second opposing surfaces. The electronic device also includes a radio frequency (RF) directional coupler carried by the first surface of the PCB and including a housing and circuitry therein defining an input port, an output port, and first and second monitoring ports. The RF directional coupler may be a stripline RF directional coupler, for example.

A first monitoring circuit is carried by the first surface of the PCB and connected to the first monitoring port. The electronic device also includes a via conductor connected to the second monitoring port and extending through the PCB to the second surface thereof, for example. A second monitoring circuit is also carried by the second surface of the PCB and connected to the via conductor. Accordingly, the electronic device provides improved bandwidth and directivity for the RF directional coupler using a reduced number of components.

The first and second monitoring circuits may include respective first and second filters. This may advantageously improve the bandwidth of the RF directional coupler below its designated operational bandwidth. The first and second monitoring circuits may also include respective first and second attenuators and respective first and second detectors coupled downstream therefrom. The first and second monitoring ports may be respective forward power and reflected power ports, for example.

The electronic device may further include an electrically conductive RF shield assembly carried on the first surface of the PCB. The electrically conductive RF shield assembly may include respective vertical wall portions extending above the housing and also extending laterally outwardly from the housing between adjacent ones of the input port, output port, and first and second monitoring ports, for example. The electrically conductive RF shield assembly may be connected to the ground plane. As will be appreciated by those skilled in the art, the RF shield advantageously improves directivity, or isolation, of the RF directional amplifier.

The housing of the RF directional coupler may be rectangularly shaped, for example, and the input port, output port, and first and second monitoring ports may be positioned in respective corners of the rectangularly shaped housing. The electronic device may further include a power amplifier coupled to the input port and an antenna coupled to the output port, for example.

A method aspect is directed to making an electronic device. The method includes providing a PCB including a ground plane and having first and second opposing surfaces. The method also includes positioning an RF directional coupler to be carried by the PCB on the first surface thereof. The RF directional coupler includes a housing and circuitry therein defining an input port, an output port, and first and second monitoring ports, for example. The method further includes positioning first monitoring circuitry to be carried by the PCB on the first surface thereof. The method also includes connecting the first monitoring circuitry to the first monitoring port, positioning second monitoring circuitry to be carried by the PCB on the second surface thereof, and connecting the second monitoring circuitry to the second monitoring port through a via extending through the PCB to the second surface thereof.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
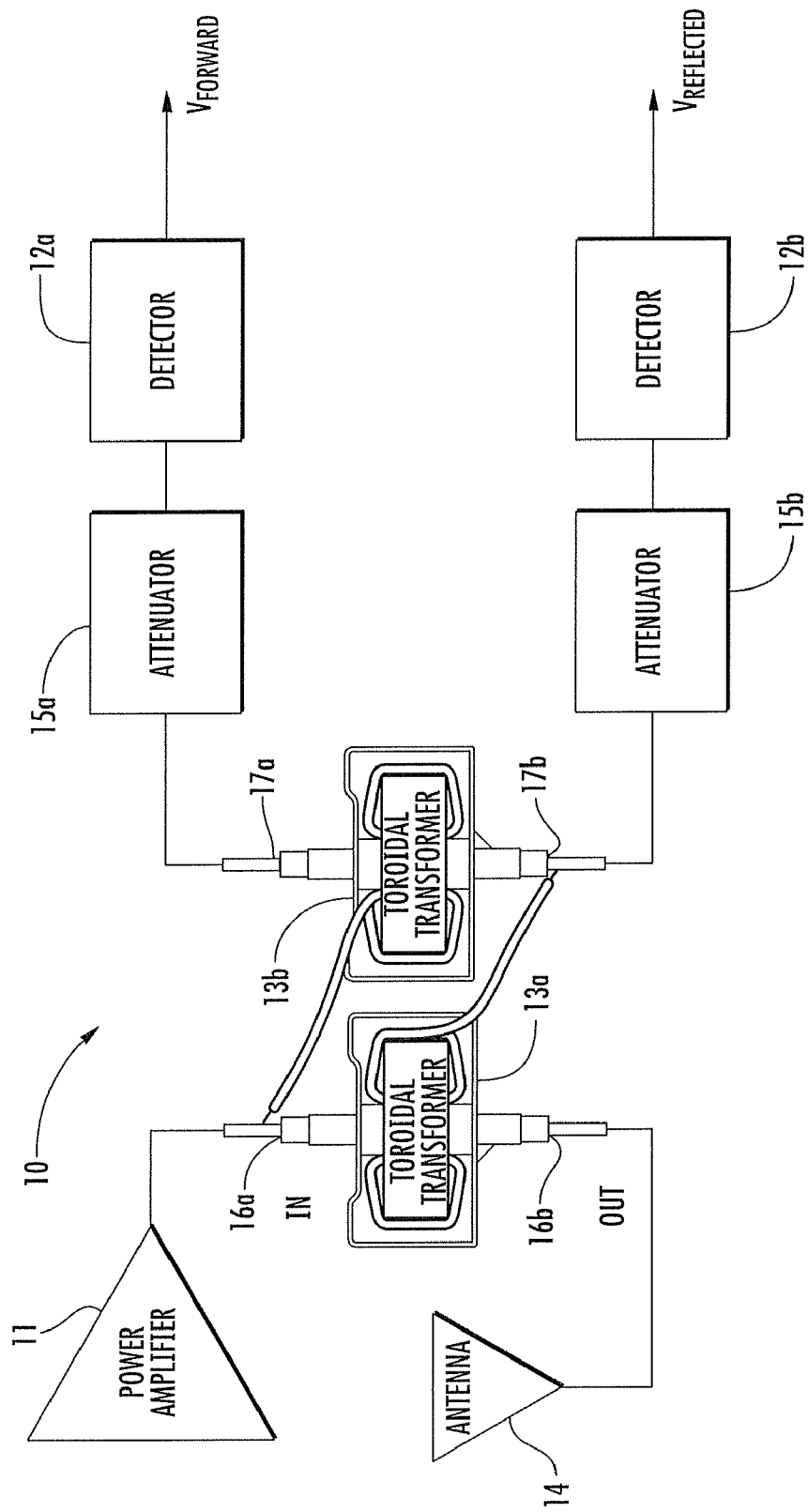
FIG. 1 is a schematic diagram of an electronic device in accordance with the prior art.
Figure 2:
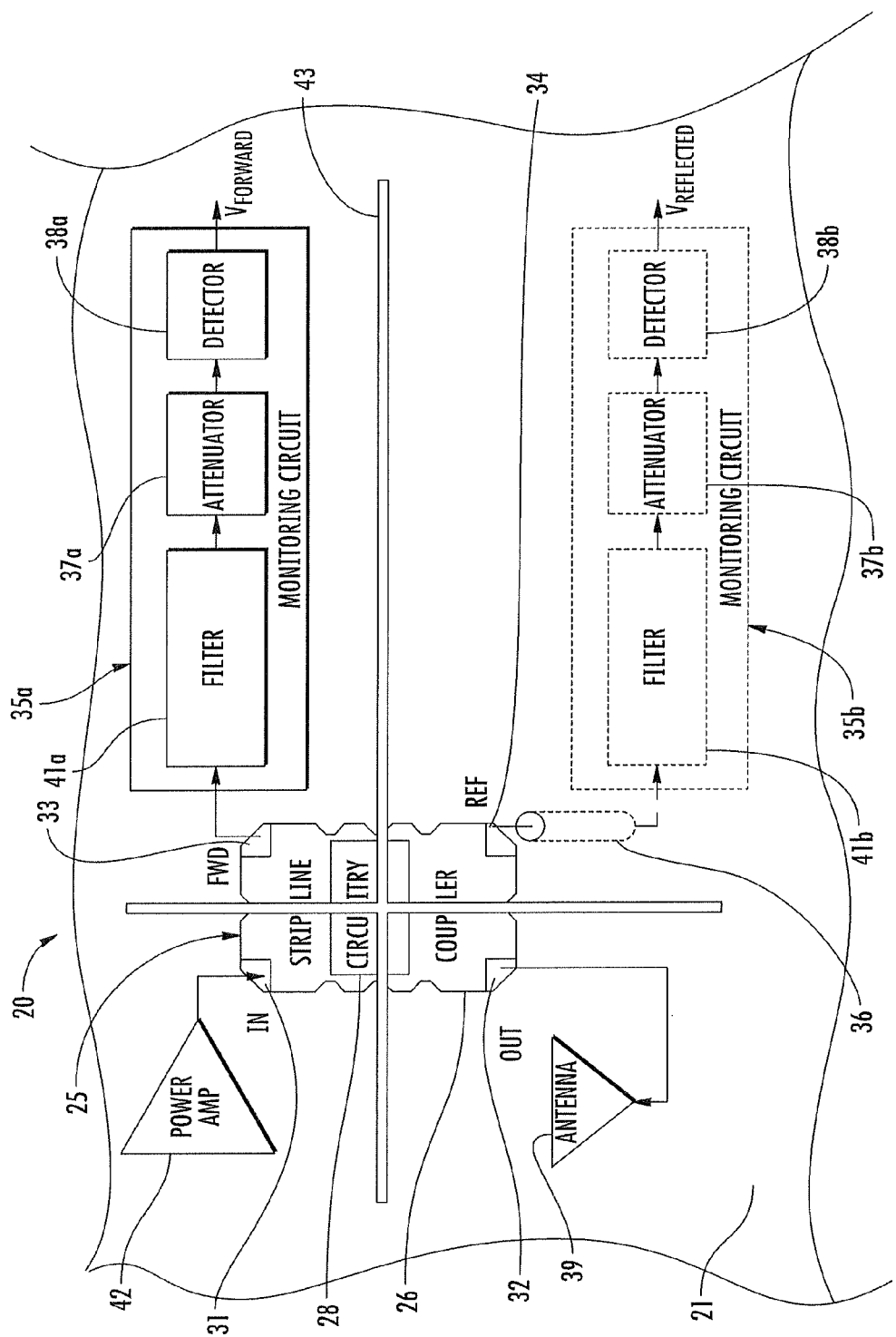
FIG. 2 is a schematic diagram of an electronic device in accordance with the present invention.
Figure 3:
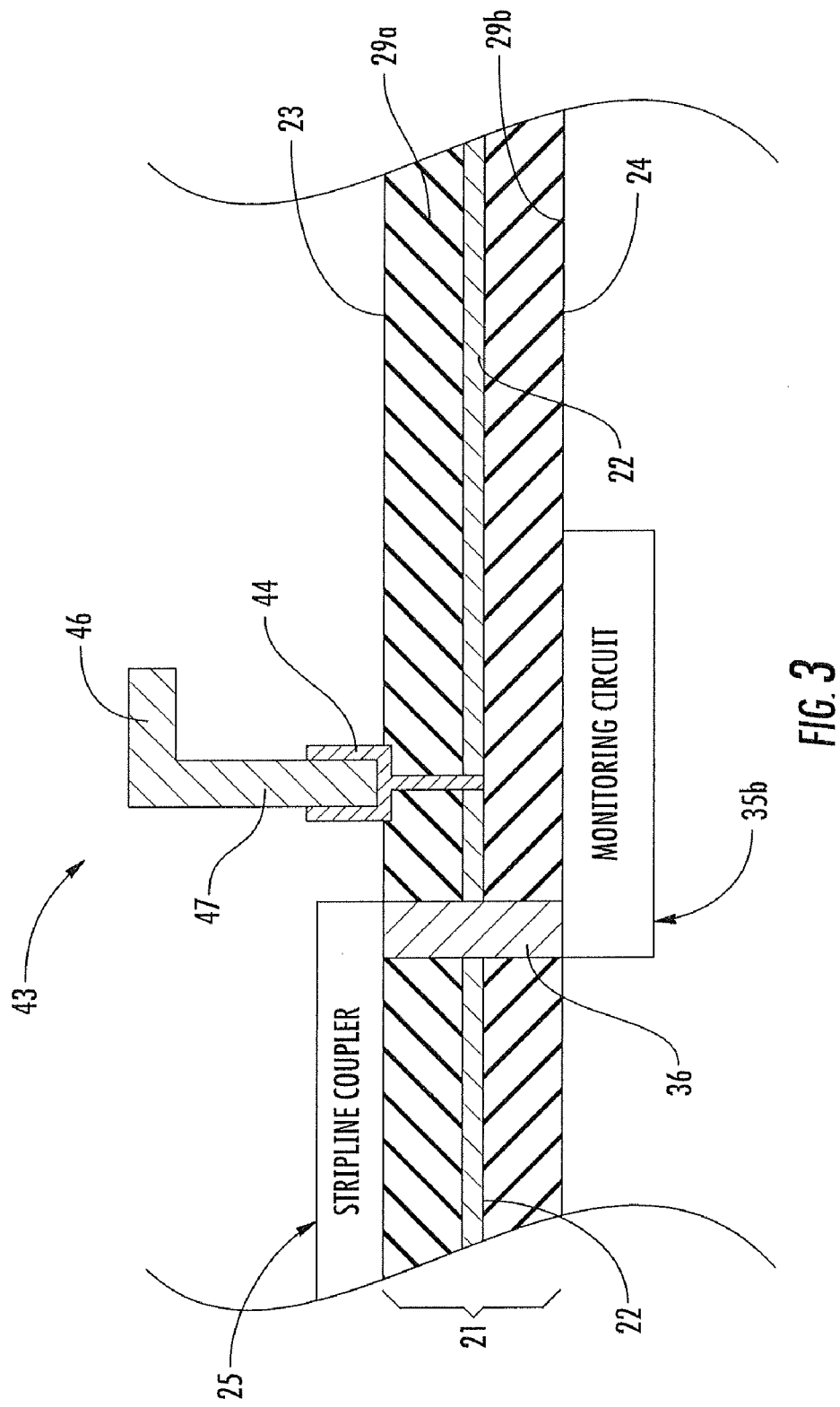
FIG. 3 is a cross-sectional view of a portion of the electronic device of FIG. 2.

Referring initially to FIGS. 2 and 3, the electronic device 20 illustratively includes a printed circuit board 21 (PCB) including a ground plane 22 sandwiched between two dielectric layers 29a, 29b and having first and second opposing surfaces 23, 24. The ground plane 22 may be a metallic layer within the PCB 21 (FIG. 3), or may be a metallic layer carried by either the first or second opposing surfaces 23, 24. Other ground plane 22 arrangements will be appreciated by those skilled in the art.

The electronic device 20 also includes a radio frequency (RF) directional coupler 25 carried by the first surface 23 of the PCB 21. The directional coupler 25 is illustratively a stripline RF directional coupler and includes a rectangularly shaped housing 26. The RF directional coupler housing 26 may be other shapes, as will be appreciated by those skilled in the art. Circuitry 28 is within the housing 26 and defines an input port 31, an output port 32, and first and second monitoring ports 33, 34. The first and second monitoring ports 33, 34 may be respective forward power and reflected power ports, for example.

The input port 31, output port 32, and first and second monitoring ports 33, 34 are positioned in respective corners of the rectangularly shaped housing 26. The positioning of the ports 31, 32, 33, 34 advantageously isolates the ports to improve directivity. The transmission line RF directional coupler 25 may be, for example, a Xinger 11, XC15000A-20S stripline directional coupler available from Anaren Microwave, Inc. of East Syracuse, N.Y. Of course, other stripline or transmission line RF directional couplers may be used.

Figure 4:
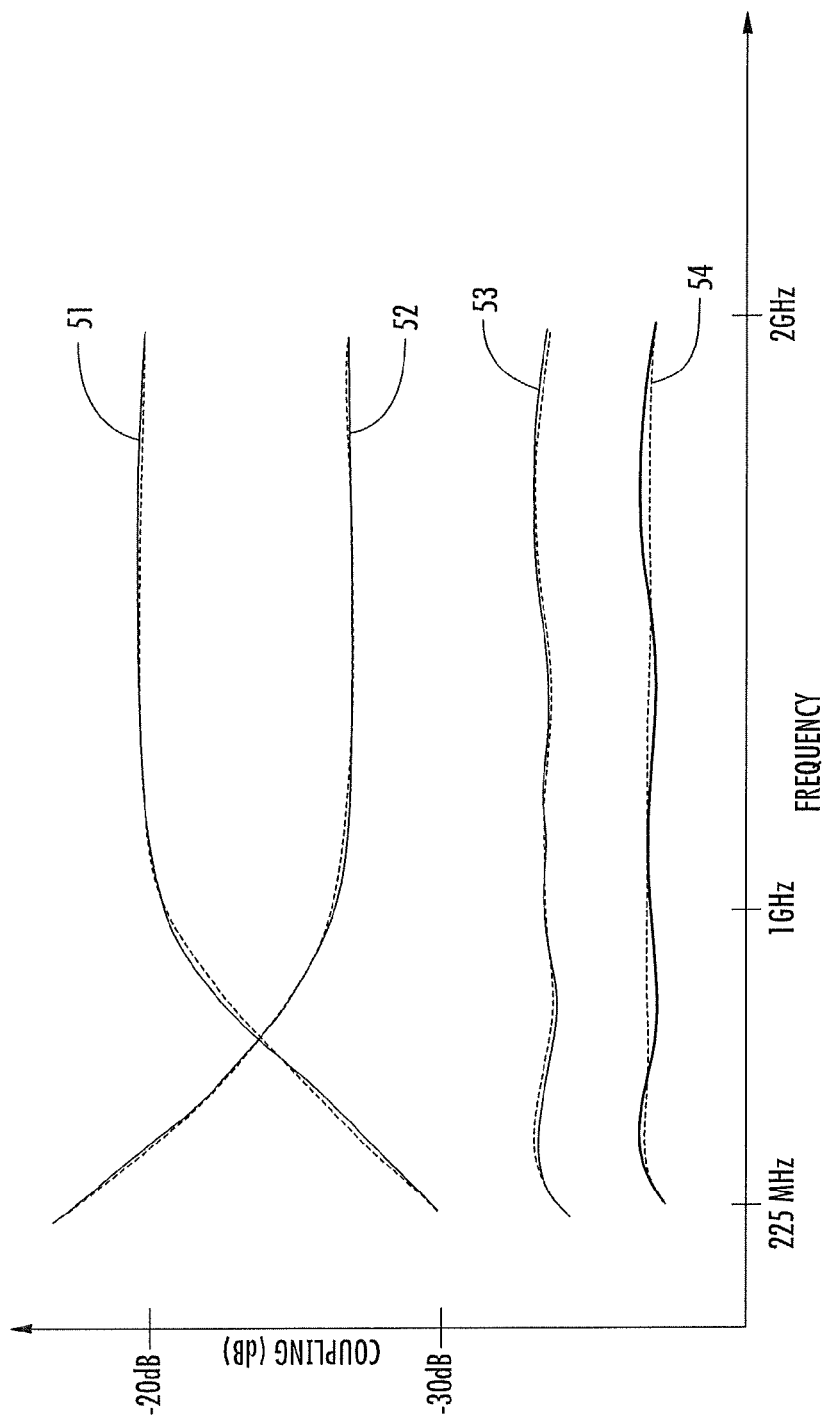
FIG. 4 is a graph of coupling responses of portions of the electronic device of FIG. 2.

Referring additionally to FIG. 4, the stripline RF directional coupler 25 may typically have a designated frequency range of between 1 GHz and 2 Ghz for −20 dB coupling. The transmission line RF directional coupler 25 generally operates at a top of a desired frequency range so that the coupling response 51 is reduced as the frequency is reduced. In other words, the transmission line RF directional coupler 25 may exhibit a high-pass response when it is used below its designated range. For example, for a desired frequency range of 225 MHz to 2 GHz, the coupling response 51 generally may change monotonically from about −30 dB to −20 dB for the frequency range from 225 MHz to 1 GHz.

A first monitoring circuit 35a is carried by the first surface 23 of the PCB 21 and connected to the first monitoring port 33 or forward power port. A via conductor 36 is illustratively connected to the second monitoring port 34, or reflected power port, and extends through the PCB 21 to the second surface 24 thereof. A second monitoring circuit 35b is carried by the second surface 24 of the PCB 21 and connected to the via conductor 36.

The via connector 36 may be a double via, or in other words, may include a plurality of conductors, and may be sized to have an impedance of 50 Ohms, for example. The plurality of conductors may be connected in parallel to reduce the inductance of the via conductor 36, as will be appreciated by those skilled in the art. Separating the first and second monitoring circuits 35a, 35b on opposing surfaces of the PCB 21 advantageously creates improved directivity of the stripline RF directional coupler 25.

The first and second monitoring circuits 35a, 35b illustratively include first and second filters 41a, 41b. The first and second filters 41a, 41b may each be a low-pass filter, for example, including capacitors, resistors, and/or inductors, and may each exhibit a low-pass response 52. As will be appreciated by those skilled in the art, the first and second filters 41a, 41b, each flatten the coupling response 53 across the desired frequency range of 225 MHz to 2 GHz, and thus, increase the bandwidth of the stripline directional RF coupler 25.

As will be appreciated by those skilled in the art, the via conductor 36 will generally alter the coupling response through the second monitoring circuit 35b. Because the coupling response through the first and second filters 41a, 41b may be different because of the via conductor 36, the first and second filters may be configured to have different bandwidths.

The first and second monitoring circuits 35a, 35b, also include respective first and second attenuators 37a, 37b and respective first and second detectors 38a, 38b coupled downstream therefrom. The first and second attenuators 37a, 37b are used to adjust the coupling level to a desired coupling level compatible with the first and second detectors 38a, 38b respectively. For example, the coupled response 53 from the first or second filters 41a, 41b may be too high and may be reduced to a desired coupling level 54 for the respective first and second detectors 38a, 38b. As will be appreciated by those skilled in the art, the forward and reflected signals at the desired coupling level 54 are each fed to the first and second detectors 38a, 38b.

The electronic device 20 also includes a power amplifier 42 coupled to the input port and an antenna 39 coupled to the output port. The electronic device 20 may be particularly advantageous in a mobile wireless communications device, for example, or other wireless communications device where a reduced physical size is desired, yet which advantageously includes a wideband power amplifier. Additionally, each of the first and second monitoring circuits 35a, 35b may include surface mount technology components to further reduce size.

Figure 5:
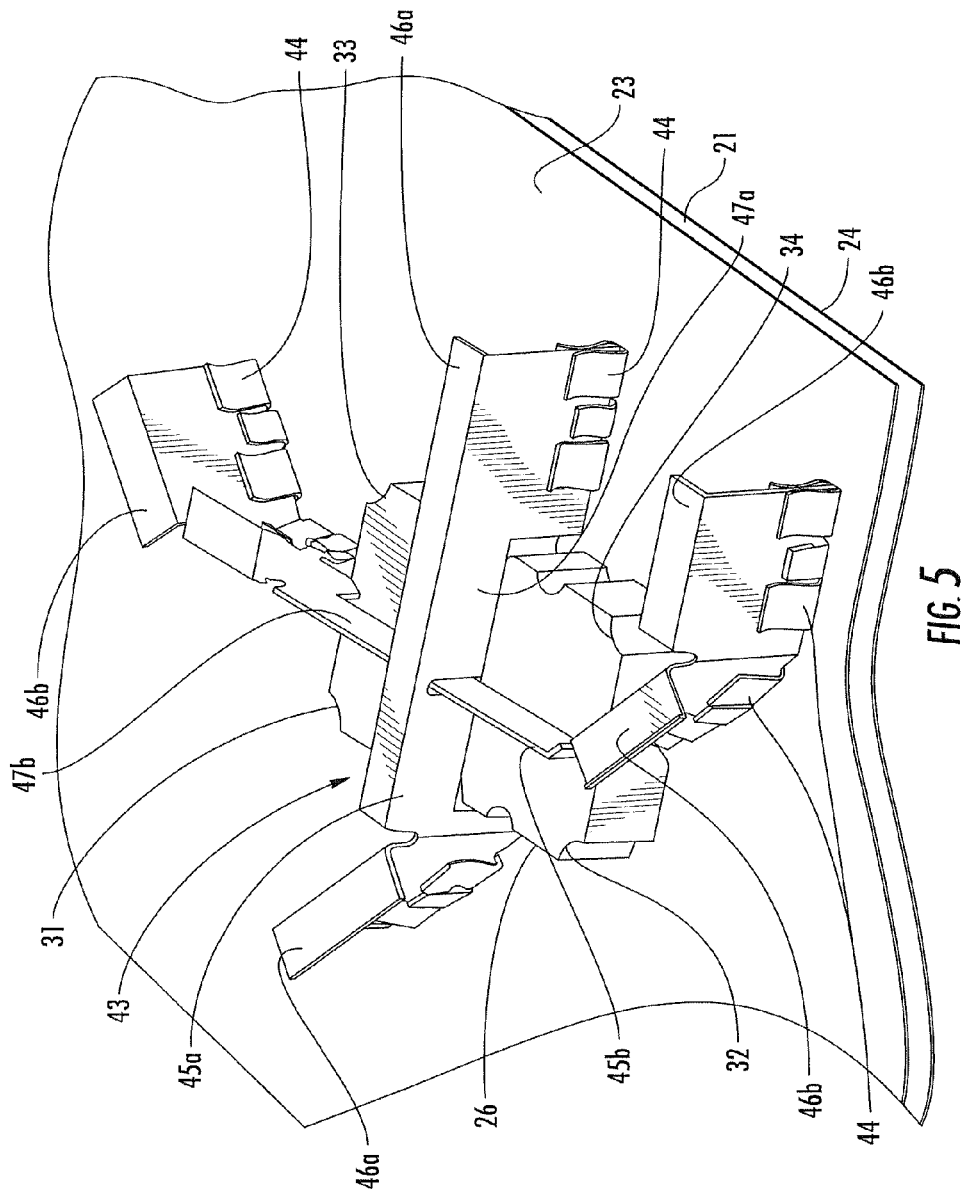
FIG. 5 is a perspective view of the conductive RF shield of the electronic device of FIG. 2

Referring now additionally to FIG. 5, an electrically conductive RF shield assembly 43 is carried on the first surface 23 of the PCB 21. The electrically conductive RF shield 43 illustratively includes respective vertical wall portions 47a, 47b extending above the housing and also extending laterally outwardly from the stripline RF directional coupler housing 26 between adjacent ones of the input port 31, output port 32, and first and second monitoring ports 33, 34. (FIG. 5). The electrically conductive RF shield assembly 43 is also connected to the ground plane, which may be parallel to the PCB first and second surfaces 23, 24.

More particularly, as illustrated, the electrically conductive RF shield assembly 43 is mateably coupled to RF shield connector 44 carried by the first surface 23 of the PCB 21 and coupled to, or soldered to, for example, the ground plane. The electrically conductive RF shield assembly 43 may be formed of a metal or metal alloy, for example, steel plated with a tin/lead combination, but other conductive materials may be used.

The electrically conductive RF shield assembly 43 advantageously improves the directivity of the stripline RF directional coupler 25 by providing additional isolation between the input port 31, output port 32, and first and second monitoring ports 33, 34. The electrically conductive RF shield assembly 43 also advantageously reduces bleedthrough to the reflected port 34 that may occur from the power amplifier 42 and the antenna 39.

The electrically conductive RF shield assembly 43 may include two-interlocking conductive RF shield portions 45a, 45b, as illustrated, and each portion may include a respective overhang portion 46a, 46b transverse to vertical wall portions 47a, 47b and generally parallel to the PCB 21. Each respective overhang portion 46a, 46b may further improve port isolation and directivity, and aid assembly.

Figure 6:
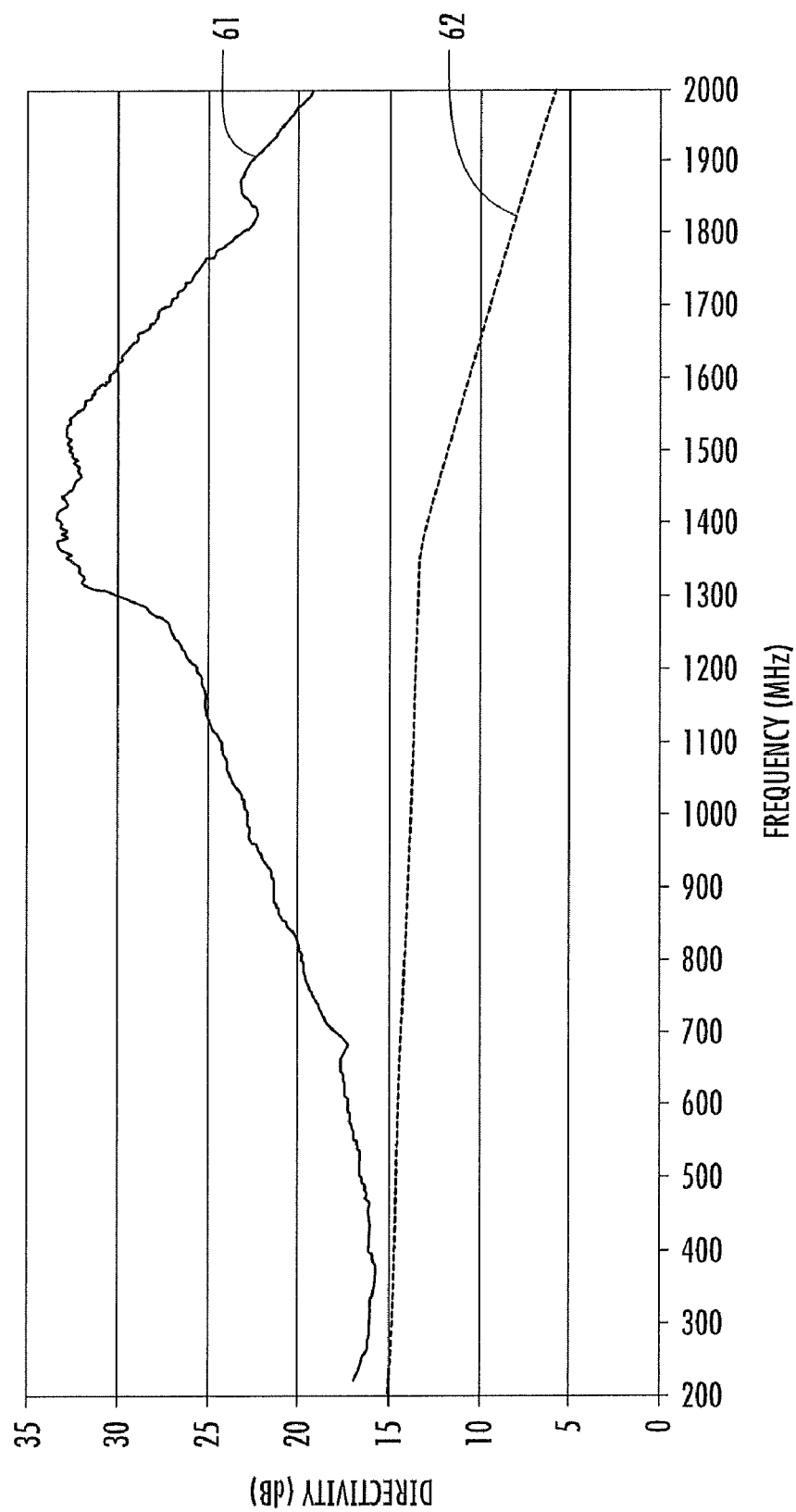
FIG. 6 is a directivity graph of the measured directivity of the electronic device of FIG. 2, and directivity of a prior art electronic device.

Referring now to FIG. 6, a directivity graph illustrates the measured directivity 61 of the electronic device 20 including the electrically conductive RF shield assembly 43 versus an approximation of a typical toroidal coupler directivity 62, as used in the prior art, is illustrated. The graph illustrates a 10-15 dB improvement in directivity from 1.2 GHz to 2 GHz.

Advantageously, as will be appreciated by those skilled in the art, the electronic device 20 may reduce production cost by reducing hand-built parts and manual soldering operations. A cost savings of approximately 80 percent as compared to prior art approaches may be realized. For example, cutting out of the PCB that is generally required for a toroidal coupler is eliminated. Still further, the electronic device 20 provides increased performance, for example, the bandwidth of the stripline RF directional coupler 25 is improved from 1 octave to over 3 octaves. Improved consistency among PCBs is also provided over prior art electronic devices including an RF directional coupler. Hand-adjustment operations, for example, from rework and tuning, are also greatly reduced.

Figure 7:
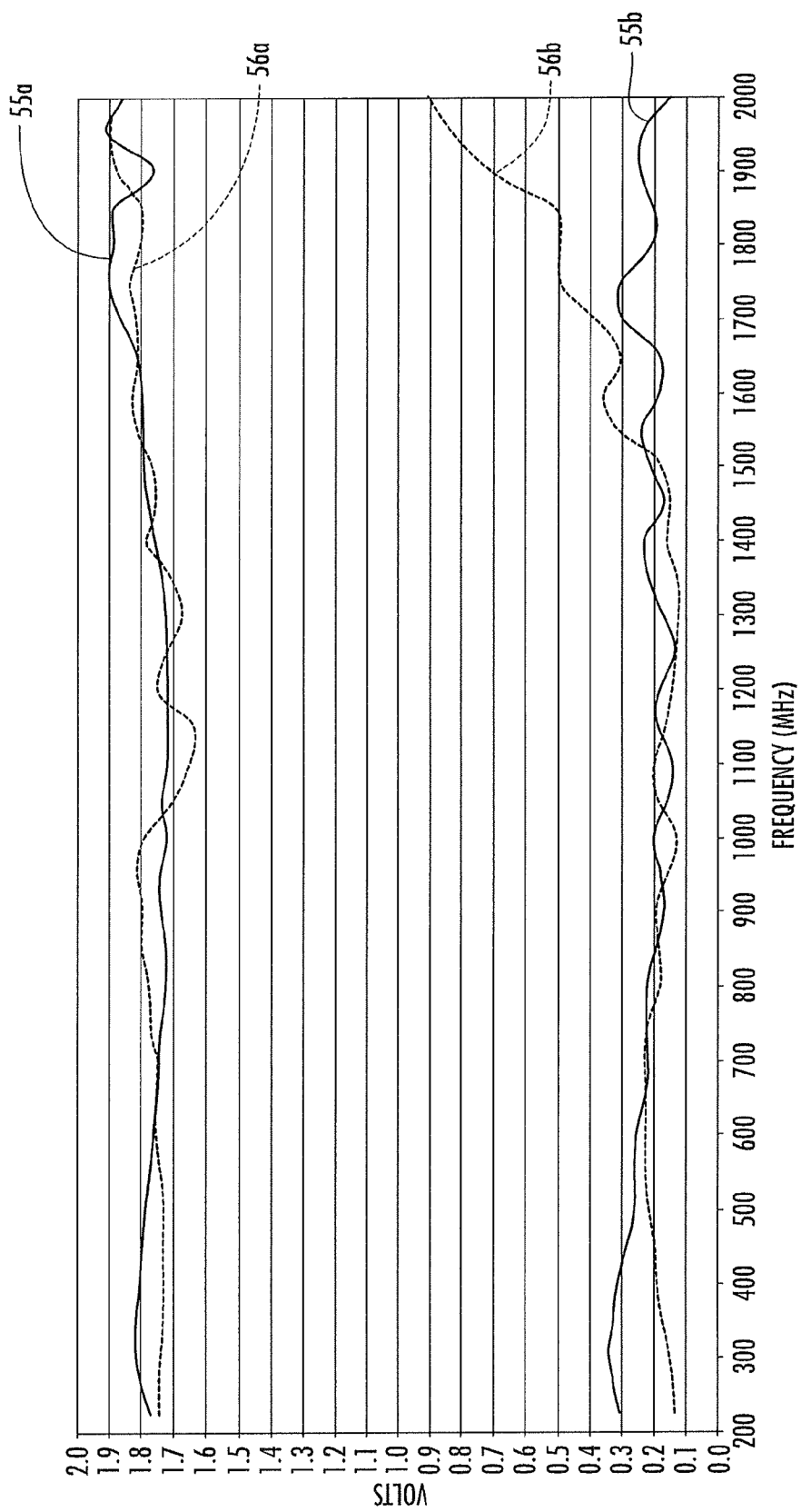
FIG. 7 is a graph of measured forward and reflected voltages for the electronic device of FIG. 2, and forward and reflected voltages of a prior art electronic device.
Figure 8:
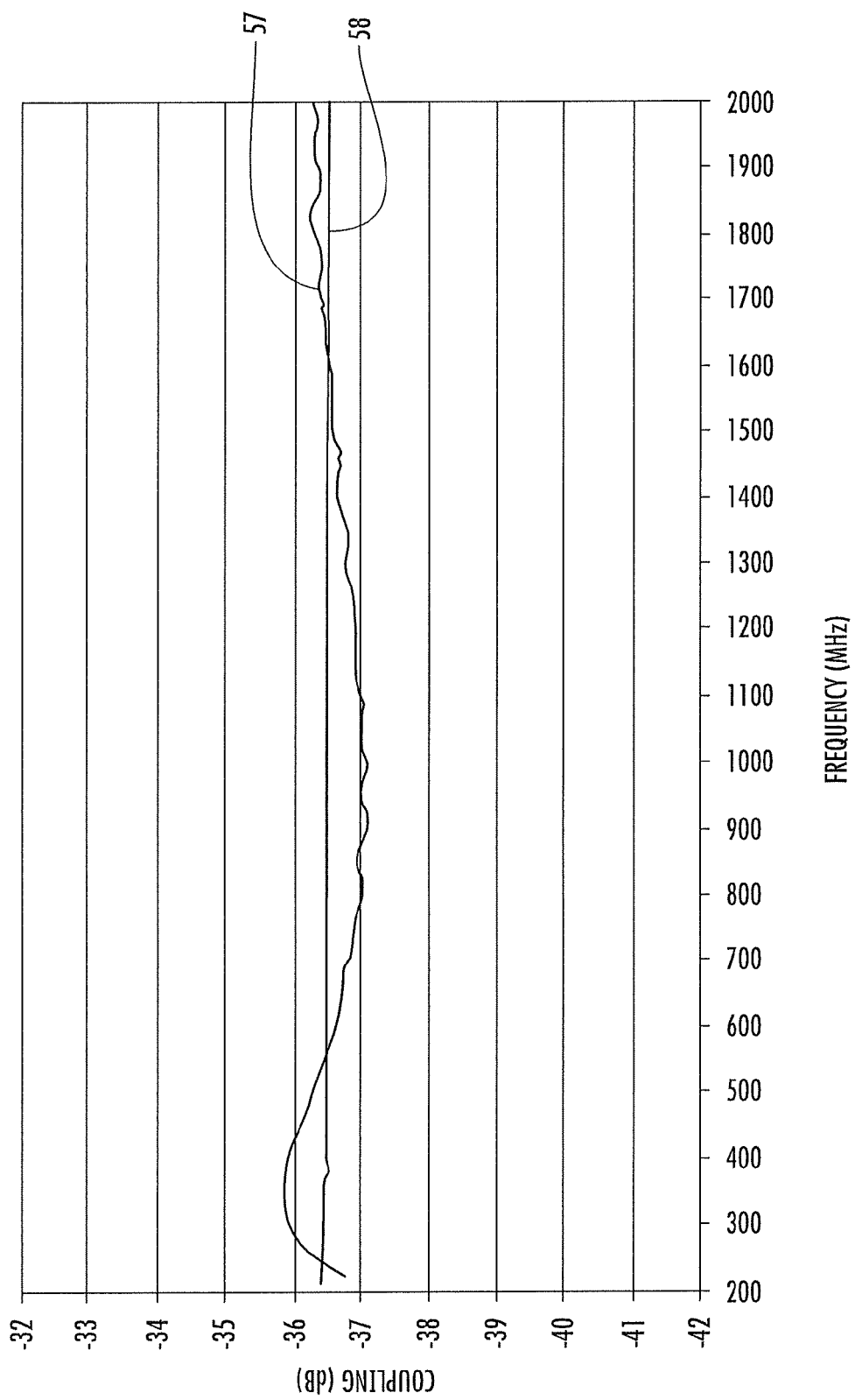
FIG. 8 is a graph of measured forward coupling and a desired coupled for the electronic device of FIG. 2.
Figure 9:
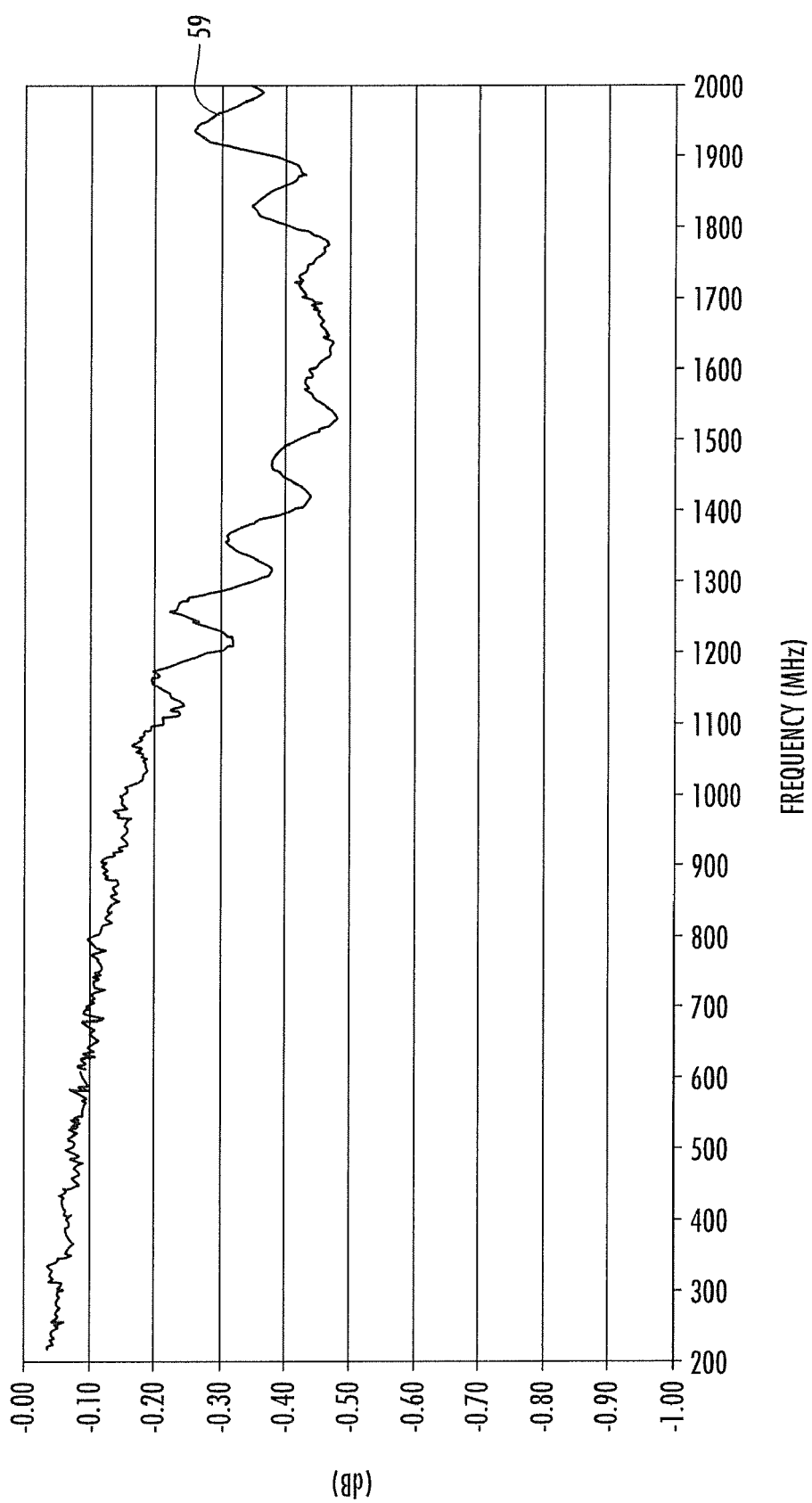
FIG. 9 is a graph of measured insertion loss of the forward power for the electronic device of FIG. 2.

Referring now to the graphs in FIGS. 7-9, measured results for the electronic device 20 are illustrated. The forward and reflected voltages 55a, 55b are graphed for the electronic device 20 against the forward and reflected voltages 56a, 56b of a prior art electronic device (FIG. 7). Additionally, the forward coupling 57 of the electronic device 20 is compared to a desired coupling level 58 of about −35 dB (FIG. 8), and provides a relatively flat response across the frequency range. Illustratively, insertion loss 59 of the forward power of the electronic device 20 is relatively small across the frequency range (FIG. 9).

A method aspect is directed to making the electronic device 20. The method includes mounting the RF directional coupler 25 onto the first surface 23 of the PCB 21 that includes the housing 26 and the circuitry therein defining the input port, the output port, and the first and second monitoring ports. The method also includes forming the first monitoring circuit 35a carried by the first surface 23 of the PCB 21 and connected to the first monitoring port 33. The method further includes forming a via conductor 36 connected to the second monitoring port 34 and extending through the PCB 21 to a second surface 24 thereof, and forming a second monitoring circuit 35b carried by the second surface of the PCB and connected to the via conductor.

Forming the first and second monitoring circuits 35a, 35b includes forming the respective first and second filters 41a, 41b. Forming the first and second monitoring circuits 35a, 35b includes forming respective first and second attenuators 37a, 37b and respective first and second detectors 38a, 38b coupled downstream therefrom.

The method further includes mounting the electrically conductive RF shield assembly 43 carried on the first surface 23 of the PCB 21 so that the respective vertical wall portions 47a, 47b extend above the housing 26 and also extend laterally outwardly from the housing between adjacent ones of the input port 31, output port 32, and first and second monitoring ports 33, 34. Mounting the electrically conductive RF shield assembly 43 also includes mounting the electrically conductive RF shield assembly to the ground plane.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
   a printed circuit board (PCB) comprising a ground plane and having first and second opposing surfaces;
   a radio frequency (RF) directional coupler carried by the first surface of said PCB and comprising a housing and circuitry therein defining an input port, an output port, and first and second monitoring ports;
   a first monitoring circuit carried by the first surface of said PCB and connected to the first monitoring port;
   a via conductor connected to the second monitoring port and extending through said PCB to the second surface thereof; and
   a second monitoring circuit carried by the second surface of said PCB and connected to said via conductor.

2. The electronic device according to claim 1, wherein said first and second monitoring circuits comprise respective first and second filters.

3. The electronic device according to claim 2, wherein said first and second monitoring circuits further comprise respective first and second attenuators and respective first and second detectors coupled downstream therefrom.

4. The electronic device according to claim 1, wherein said first and second monitoring ports comprise respective forward power and reflected power ports.

5. The electronic device according to claim 1, further comprising an electrically conductive RF shield assembly carried on the first surface of said PCB and comprising respective vertical wall portions extending above said housing and also extending laterally outwardly from said housing between adjacent ones of the input port, output port, and first and second monitoring ports.

6. The electronic device according to claim 5, wherein said electrically conductive RF shield assembly is connected to said ground plane.

7. The electronic device according to claim 1, wherein said housing comprises a rectangularly shaped housing; and wherein the input port, output port, and first and second monitoring ports are positioned in respective corners of said rectangularly shaped housing.

8. The electronic device according to claim 1, further comprising a power amplifier coupled to the input port and an antenna coupled to the output port.

9. The electronic device according to claim 1, wherein said RF directional coupler comprises a transmission line RF directional coupler.

10. An electronic device comprising:
a printed circuit board (PCB) comprising a ground plane and having first and second opposing surfaces;
a transmission line radio frequency (RF) directional coupler carried by the first surface of said PCB and comprising a housing and circuitry therein defining an input port, an output port, and first and second monitoring ports;
a first monitoring circuit carried by the first surface of said PCB and connected to the first monitoring port;
a via conductor connected to the second monitoring port and extending through said PCB to the second surface thereof;
a second monitoring circuit carried by the second surface of said PCB and connected to said via conductor; and
an electrically conductive RF shield assembly carried on the first surface of said PCB, connected to said ground plane, and comprising respective vertical wall portions extending above said housing and also extending laterally outwardly from said housing between adjacent ones of the input port, output port, and first and second monitoring ports.

11. The electronic device according to claim 10, wherein said first and second monitoring circuits comprise respective first and second filters having different bandwidths.

12. The electronic device according to claim 11, wherein said first and second monitoring circuits further comprise respective first and second attenuators and respective first and second detectors coupled downstream therefrom.

13. The electronic device according to claim 10, wherein said first and second monitoring ports comprise respective forward power and reflected power ports.

14. The electronic device according to claim 10, wherein said housing comprises a rectangularly shaped housing; and wherein the input port, output port, and first and second monitoring ports are positioned in respective corners of said rectangularly shaped housing.

15. The electronic device according to claim 10, further comprising a power amplifier coupled to the input port and an antenna coupled to the output port.

16. A method of making an electronic device comprising:
mounting a radio frequency (RF) directional coupler onto a first surface of a printed circuit board (PCB) and comprising a housing and circuitry therein defining an input port, an output port, and first and second monitoring ports;
forming a first monitoring circuit carried by the first surface of the PCB and connected to the first monitoring port;
forming a via conductor connected to the second monitoring port and extending through the PCB to a second surface thereof; and
forming a second monitoring circuit carried by the second surface of the PCB and connected to the via conductor.

17. The method according to claim 16, wherein forming the first and second monitoring circuits comprise forming respective first and second filters.

18. The method according to claim 17, wherein forming the first and second monitoring circuits further comprise forming respective first and second attenuators and respective first and second detectors coupled downstream therefrom.

19. The method according to claim 16, further comprising mounting an electrically conductive RF shield assembly carried on the first surface of the PCB and comprising respective vertical wall portions extending above the housing and also extending laterally outwardly from the housing between adjacent ones of the input port, output port, and first and second monitoring ports.

20. The method according to claim 19, wherein mounting the electrically conductive RF shield assembly comprises mounting the electrically conductive RF shield assembly to the ground plane.

\* \* \* \* \*